United States Patent [19]

Bridenbaugh et al.

[11] Patent Number: 5,659,181
[45] Date of Patent: Aug. 19, 1997

[54] ARTICLE COMPRISING α-HEXATHIENYL

[75] Inventors: Paul Michael Bridenbaugh, Somerville; Robert McLemore Fleming, Chatham; Robert Cort Haddon, Dover; Robert Alfred Laudise, Berkeley Heights; Theo Siegrist, Neshanic Station, all of N.J.

[73] Assignee: Lucent Technologies Inc., Murray Hill, N.J.

[21] Appl. No.: 393,494

[22] Filed: Mar. 2, 1995

[51] Int. Cl.$^6$ .............................. H01L 35/24; H01L 51/00
[52] U.S. Cl. ................................ 257/40; 257/64; 257/66; 257/72
[58] Field of Search .......................... 257/40, 66, 258, 257/347, 443, 64, 72; 252/510, 511

[56] References Cited

U.S. PATENT DOCUMENTS

| 5,315,129 | 5/1994 | Forrest et al. | 257/21 |
| 5,347,144 | 9/1994 | Garnier et al. | 257/40 |

FOREIGN PATENT DOCUMENTS 0 528 662 A1 of 0000 European Pat. Off. .

OTHER PUBLICATIONS

Servet et al., "X–Ray Determination of the Crystal Structure and Orientation of Vacuum Evaporated Sexithiophene Films," *Advanced Materials*, vol. 5, No. 6, 1993, pp. 461–464.

"All–Polymer Field–Effect Transistor Realized by Printing Techniques", by F. Garnier et al., *Science*, vol. 265, 16 Sep. 1994, pp. 1684–1686.

"Polythienylenevinylene Thin–Film Transistor with High Carrier Mobility", by H. Fuchigami et al., *Applied Physics Letters*, vol. 63 (10), 6 Sep. 1993, pp. 1372–1374.

"An Analytical Model for Organic–Based Thin–Film Transistors", by G. Horowitz et al., *Journal of Applied Physics*, vol. 70 (1), 1 Jul. 1991, pp. 469–475.

"Polymorphism and Charge Transport in Vacuum–Evaporated Sexithiophene Films", by B. Servet et al., *Chem. Mater.*, vol. 6, No. 10, 1994, pp. 1809–1815.

"Mesophase Formation in α–Sexithienyl at High Temperature—An X–Ray Diffraction Study", by S. Destri et al., *Advanced Materials*, vol. 5, No. 1, 1993, pp. 43–45.

"Polythiophene Field–Effect Transistor with Polypyrrole Worked as Source and Drain Electrodes", by H. Koezuka et al., *Applied Physics Letters*, vol. 62, No. 15, 12 Apr. 1993, pp. 1794–1796.

"Thin–Film Transistors Based on Alpha–Conjugated Oligomers", by G. Horowitz et al., *Synthetic Metals*, 41–43 (1991), pp. 1127–1130.

"Junction Field–Effect Transistor Using Polythiophene as an Active Component", by S. Miyauchi et al., *Synthetic Metals*, 41–43 (1991), pp. 1155–1158.

"Amorphous and Microcrystalline Semiconductor Devices: Optoelectronic Devices", J. Kanicki, editor, Artech House, Boston, London, pp. 102–103.

*Primary Examiner*—Sara W. Crane
*Attorney, Agent, or Firm*—Eugen E. Pacher

[57] ABSTRACT

A previously unknown phase of α-hexathienyl, designated α-6T/HT, exhibits diffraction peaks at 2θ=4.31°, 8.64°, 12.96°, 17.32°, 26.15° and 29.08° in a CuK$_\alpha$ powder X-ray diffraction pattern, and is expected to have properties (e.g., high hole mobility) that make the phase desirable for use in, e.g., thin film transistors. Substitution of thin films of α-6T/HT for prior art organic thin films in thin film transistors and other devices is contemplated.

7 Claims, 2 Drawing Sheets

ARTICLE COMPRISING α-HEXATHIENYL

FIELD OF THE INVENTION

This invention pertains to articles that comprise α-hexathienyl (α6T), e.g., thin film transistors comprising an α-6T layer.

BACKGROUND OF THE INVENTION

Considerable effort has recently been directed towards thin film transistors (TFTs) with organic active layer. See, for instance, F. Garnier et al., *Science*, Vol. 265, p. 1684. Among the organic compounds that are currently most frequently considered for use as active layer material is α-hexathienyl, frequently referred to as α-6T. As shown, for instance, F. Garnier et al., such TFT comprises an organic active layer in contact with spaced apart source and drain electrodes, and spaced from a gate electrode. See, for instance, G. Horowitz, *J. Applied Physics*, Vol. 70(1), p. 469.

However, despite considerable research and development effort, "organic" TFTs have not yet reached commercialization, at least in part due to relatively poor device characteristics of typical prior art devices. It is generally believed that the poor device characteristics are at least in part due to the relatively low quality of typical organic active layers.

A recent significant improvement in device characteristics resulted from a change in device structure. See co-assigned U.S. patent application Ser. No. 08/353,024, filed Dec. 9, 1994 by A. Dodabalapur et al.

A further recent significant advance resulted from the discovery of an improved method of making organic compounds that are useful as active layer material. See co-assigned U.S. patent application Ser. No. 08/353,032, filed Dec. 9, 1994 by A. Dodabalapur et al. Using the novel synthesis method the inventors of the '032 application were able to make films of α-6T that had room temperature conductivity substantially below $10^{-8}$ S/cm, and TFTs that comprise the improved α-6T had on/off ratios greater $10^6$. As is conventional, the α-6T layer was formed by sublimation. The above referenced two patent applications and the Garnier et al. article are incorporated herein by reference.

Despite the recent advances, it would still be of considerable interest to have available α-6T of still higher quality, since such improvement is likely to translate into improved device characteristic. This application discloses a novel form of -6T which, on theoretical grounds, is believed to be, inter alia, a promising active layer material for organic TFTs.

SUMMARY OF THE INVENTION

In a broad aspect the invention is embodied in a novel phase of α6T, to be referred to as α6HT. More specifically, the invention is embodied in an article (e.g., a TFT, or an article that comprises a multiplicity of TFTs such as a flat panel display or an electronic memory) that comprises a quantity of α-6T. Significantly, the quantity of α-6T consists substantially of a phase of α-6T that exhibits diffraction peaks at 2θ=4.31, 8.64, 12.96, 17.32, 26.15 and 29.08 degrees in its CuK$_\alpha$ powder X-ray diffraction pattern. The novel phase is designated α-6T/HT and exemplarily is produced by a process that comprises solidifying at least a portion of a mass of molten α-6T such that the solidified material consists substantially of α-6T/HT. According to our present understanding, α-6T/HT has monoclinic crystal symmetry, with unit cell axes a=0.914 nm, b=0.568 nm, and c=2.067 nm, and monoclinic angle β=98°, all within about ±1%. The angle β is the angle between the a and c crystallographic axes, as is conventional.

DETAILED DESCRIPTION

It is conventional in the prior art to form an α-6T layer by sublimation onto a cool substrate from a quantity of α-6T that is maintained at a temperature close to the melting point of the quantity of material. The resulting α-6T layers typically are highly polycrystalline and had relatively low carrier mobility. The prior art α-6T will be referred to as α-6T/LT. FIG. 7 of the above referenced '032 patent application shows the X-ray diffraction pattern of an exemplary sample of α-6T/LT.

The '032 application discloses a novel method of making α-6T/LT that results in substantially improved material, and FIG. 6 of the '032 application shows the X-ray diffraction pattern of a sample of the improved α-6T/LT. The improved material has high carrier mobility, and yields TFTs with high current on/off ratios.

The prior art contains assertions of polymorphism in α-6T. See for instance, B. Servet et al., *Chemistry of Materials*, Vol. 6, p. 1809 (1994). However, none of the "phases" reported in the Servet et al. paper corresponds, to the best of our knowledge, to the α-6T/HT of interest herein.

See also S. Destri et al., *Advanced Materials*, Vol. 5 (1), p. 43 (1993), which reports mesophase formation in α-6T at high temperature. These authors report obtaining high temperature (the material was quenched from 305°–310° C.) X-ray diffraction patterns containing, in addition to peaks attributable to the known phase of crystalline α-6T, also peaks that are not attributable to crystalline α-6T. See especially FIG. 3 of that reference, which shows the diffraction pattern of conventional sublimated α-6T, as well as the pattern of α-6T quenched from 307° C. In the latter curve several peaks are identified as not associated with the conventional crystalline phase of α-6T but as belonging to the mesophase.

In view of the prior art reports of a high temperature mesophase, the discovery of the existence of a high temperature crystalline phase of α-6T, namely, the phase α-6T/HT, came as a surprise to us. Not only is α-6T/HT a new form of α-6T but, based on band structure considerations, it is currently our belief that α-6T/HT is likely to have properties that make it a desirable material for applications such as organic TFTs.

Figure 1:
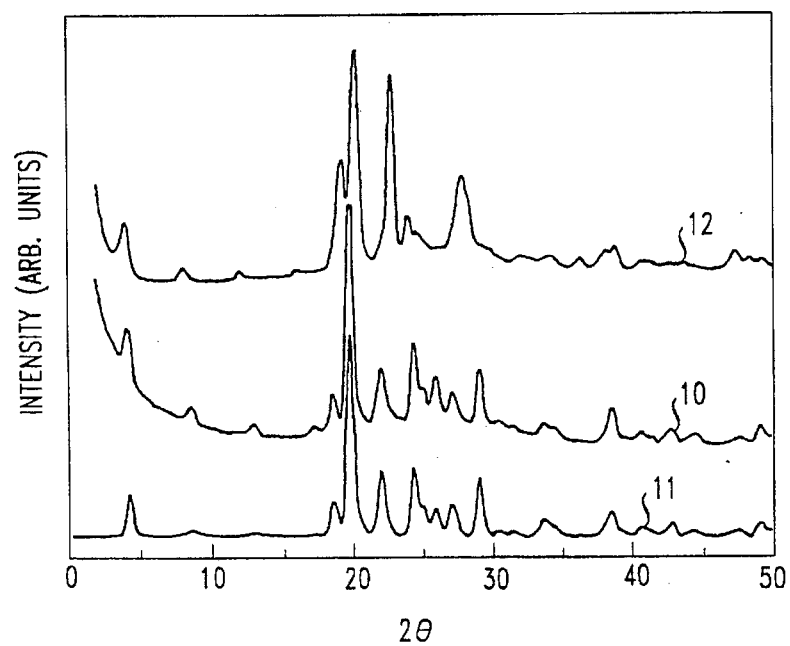
FIG. 1 shows powder X-ray diffraction patterns.

As those skilled in the art know, a material can generally be identified by its X-ray diffraction pattern. FIG. 1 shows the measured X-ray powder diffraction (CuK$_\alpha$ radiation) pattern (10) of a sample of α-6T/HT, together with the calculated pattern 11. The calculated pattern is based on the results of the analysis of single crystals of α-6T/HT. The crystals were translucent, with an orange luster. Integrated X-ray intensities were collected with graphite monochromatized CuK$_\alpha$ radiation on a conventional diffractometer, and the crystallographic analysis was carried out on a conventional computer work station using a known structure package. The sulfur and carbon atoms were refined anisotropically, and for the hydrogen atoms a common isotropic temperature factor was refined. No other constraints were applied. The analysis showed that α-6T/HT has monoclinic crystal symmetry, with unit axes a=0.914 nm, b=0.568 nm, c=2.067 nm and β=98°, with uncertainty of about ±1%. Inspection of FIG. 1 reveals essentially perfect agreement between the measured and calculated powder diffraction patterns (after subtraction of the background scattering from the measured pattern), lending strong support to the results of the single crystal analysis.

FIG. 1 also shows a $CuK_\alpha$ powder diffraction pattern (12) of the prior art material α-6T/LT. As is evident, there are substantial differences between patterns 10 and 12, indicative of the substantial difference in structure between α-6T/HT and α-6T/LT. For instance, prior art pattern 12 exhibits peaks at 2θ=3.95°, 7.90°, 11.84° and 15.82°, whereas pattern 10 does not have peaks at these diffraction angles but instead has peaks at 4.31°, 8.64°, 12.96° and 17.32°. Furthermore, the peaks at 2θ=26.15° and 29.08° in pattern 10 are not observed in pattern 12. Conversely, pattern 12 has a substantial peak at θ=22.68°, whereas pattern 10 lacks this feature.

Figure 2:
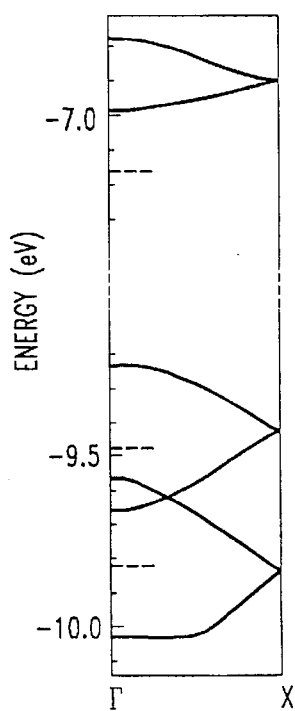
FIGS. 2–4 shows calculated energy band diagrams for α-6T/HT.
Figure 3:
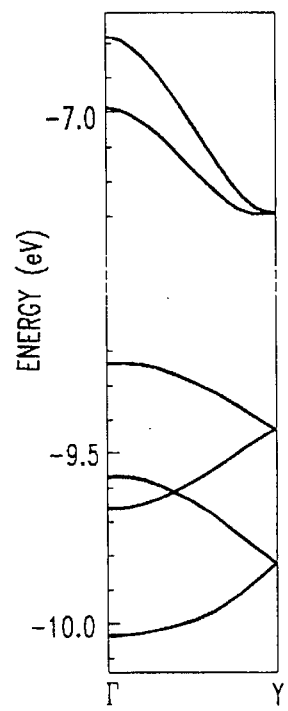
Figure 4:
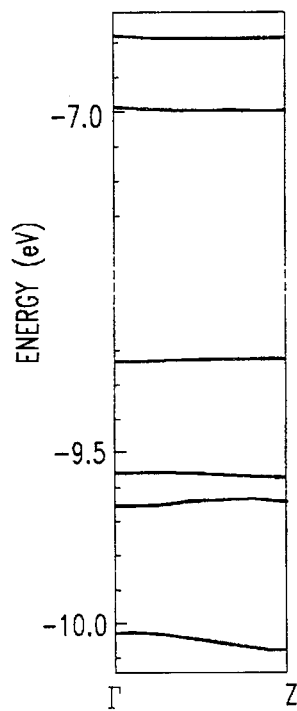

Extended Huckel theory band structure calculations show that α-6T/HT is an indirect gap semiconductor, with the conduction band minimum at Y and the valence band maximum at Γ. The conduction and valence bands both show a (for a molecular crystal) remarkable degree of dispersion along X and Y, and show substantially no dispersion along Z. The calculated energy gap is 1.95 eV. FIGS. 2-4 show the calculated dispersion relations for the four highest occupied and two lowest unoccupied bands of α-6T/HT, where Γ=(0, 0, 0), X=(a*/2, 0, 0), Y=(0, b*/2, 0) and Z=(0, 0, c*/2), where a*, b* and c* are the conventional reciprocal lattice vectors. In FIG. 2, the dashed lines represent the corresponding energy levels in the free molecule. Extended Huckel theory band structure calculations are conventional, as is the above band structure nomenclature.

The calculated electronic bandstructure of α-6T/HT is strikingly similar to that of the 2-dimensional organic superconductors based on bis(ethylenedithio) tetrathiafulvalene (ET), e.g., κ-$(ET)_2Cu(NCS)_2$. This suggests potentially high hole mobility of α-6T/HT, and thus potential usefulness of α-6T/HT (especially in single crystal form) as active material in TFTs. The suggestion is based on the approximate proportionality (in a free electron model) of carrier mobility to the width of the relevant energy band. The bandwidth calculated for κ-$(ET)_2Cu(NCS)_2$ at Γ is 0.56 eV for the band which crosses the Fermi level, and the valence band of α-6T/HT is calculated by us to have a width of 0.40 eV at Γ. In view of the similar bandwidths the two materials can be expected to exhibit similar hole mobilities. Measurements indicate that the prior art material has hole mobility ≥0.2 $cm^2$/V.s. Thus, the inventive material is likely to also have a hole mobility of order 0.2 $cm^2$/V.s, which is considerably higher than the hole mobility typically observed in prior art α-HT.

We will now describe an exemplary method of making α-6T/HT.

Figure 5:
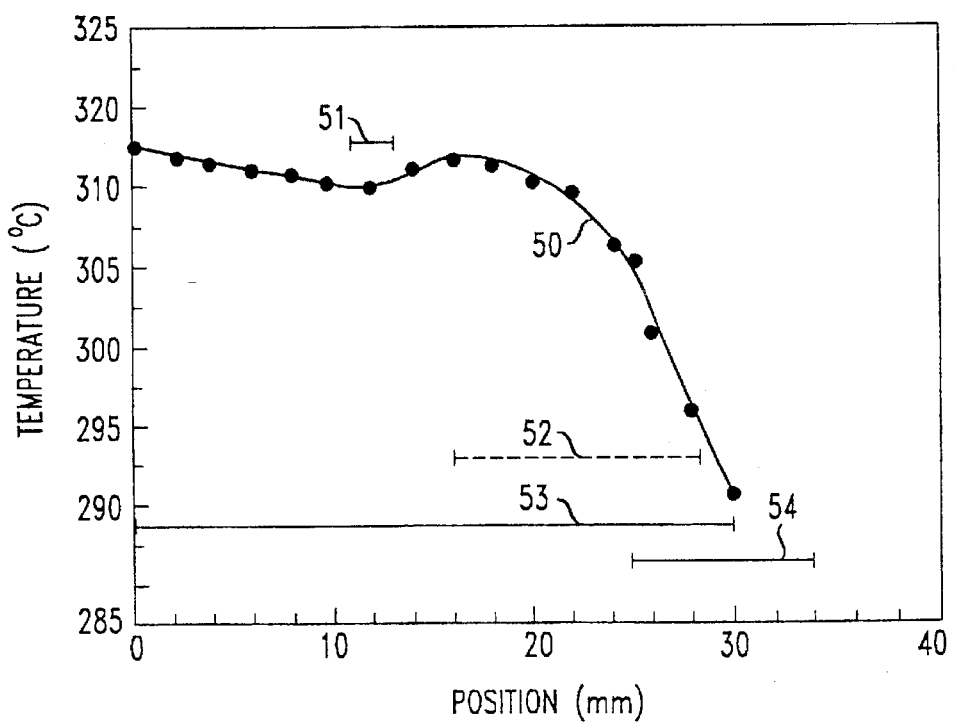
FIG. 5 shows an exemplary temperature profile in apparatus that was used to grow single crystal α-6T/HT.

A quantity of α-6T was synthesized and purified substantially as described in the above referred-to '032 patent application, and the thus produced material was placed into a borosilicate glass capillary, with great care being taken to exclude air and moisture from the capillary. After flame sealing the capillary it was transferred to a conventional light microscope with hot stage, the latter modified to produce a defined temperature gradient along the capillary. An exemplary temperature profile is shown in FIG. 5, wherein numerals 50–54 refer to, respectively, the temperature profile, the position of the viewing port, the approximate region of best crystal growth, the position of the capillary sample tube, and the position of a brass "heat leak tube". As can be seen, the temperature gradient over a substantial distance is about 0.1° C./mm.

The capillary was heated to a maximum temperature above 309.5° C. but below about 315° C., followed by slow cooling (5°–0.1° C./min) without moving of the capillary. Microscope observation showed that the red-orange starting material melted at about 309° C. and typically froze to a red-orange product. If the temperature was allowed to exceed about 315° C. the material typically froze to an undesirable brown-black product. It is believed that protracted heating of α-6T above about 315° C. results in decomposition and polymerization of the material. The slow cool resulted in growth of crystals, with the best crystals produced at the slower rates and in the region of steepest gradient. If highly polycrystalline material or films are desired, more rapid cooling is advantageous. Slow cooling was continued until the capillary was below 280° C.

The above described melt growth method has produced high quality single crystals and single phase powders of α-6T/HT. Undoubtedly it will be possible, by building on our results, to produce α-6T/HT also by other methods and/or in other than single crystal and powder form, e.g., as a thin film on an appropriate substrate. For instance, our preliminary results indicate that α-6T/HT films can be formed by sublimation onto a substrate, provided the substrate is maintained at a sufficiently high temperature, e.g., 295° C. and above. At lower substrate temperatures (e.g., 275° C.), the prior art phase α-6T/LT is formed. Thus, we currently contemplate substitution of α-6T/HT films for the organic active layer in prior art TFTs, including the TFTs disclosed in the above referenced '024 patent application, and in the references cited therein, all of which are incorporated herein by reference. Such substitution could be one for one, and would generally not require any change in device design, or in, for instance, the circuitry for a flat panel display.

The invention claimed is:

1. An article comprising a quantity of α-hexathienyl;

CHARACTERIZED IN THAT said quantity of α-hexathienyl consists substantially of a phase of α-hexathienyl that exhibits diffraction peaks at 2θ=4.31°, 8.64°, 12.96°, 17.32°, 26.15° and 29.08° in its $CuK_\alpha$ powder X-ray diffraction pattern.

2. The article of claim 1, wherein said phase of α-hexathienyl has monoclinic crystal symmetry, with unit cell axes a=0.914 nm, b=0.568 nm, and c=2.067 nm, and monoclinic angle β=98°, all within about ±1%.

3. The article of claim 1, wherein said phase is produced by a process that comprises solidifying at least a portion of a mass of molten α-hexathienyl.

4. The article of claim 1, wherein said phase is produced by a process that comprises deposition of α-hexathienyl on a substrate, said substrate being at a temperature of 295° C. or above.

5. The article of claim 1, wherein said quantity comprises a film of said phase.

6. Article according to claim 5, comprising one or more thin film transistors, a given one of said thin film transistors comprising a film of said phase of α-hexathienyl in contact with spaced apart source and drain electrodes, respectively, and further comprising a gate electrode spaced from said film.

7. Article according to claim 6, wherein the article is a flat screen display.

* * * * *